US012353686B2

(12) United States Patent
Rusch et al.

(10) Patent No.: US 12,353,686 B2
(45) Date of Patent: Jul. 8, 2025

(54) DISCOVERING AND TESTING A TOPOLOGY OF A PERIPHERAL COMPONENT INTERCONNECT BOARD

(71) Applicant: VIAVI Solutions Inc., Chandler, AZ (US)

(72) Inventors: Jason Rusch, Elk River, MN (US); Yanqiu Xu, Shanghai (CN)

(73) Assignee: VIAVI Solutions Inc., Chandler, AZ (US)

( * ) Notice: Subject to any disclaimer, the term of this patent is extended or adjusted under 35 U.S.C. 154(b) by 0 days.

(21) Appl. No.: 18/259,360

(22) PCT Filed: Dec. 16, 2021

(86) PCT No.: PCT/CN2021/138849
§ 371 (c)(1),
(2) Date: Jun. 26, 2023

(87) PCT Pub. No.: WO2023/108552
PCT Pub. Date: Jun. 22, 2023

(65) Prior Publication Data
US 2024/0061556 A1     Feb. 22, 2024

(51) Int. Cl.
*G06F 3/048*      (2013.01)
*G06F 3/0482*    (2013.01)
*G06F 3/0484*    (2022.01)

(52) U.S. Cl.
CPC .......... *G06F 3/0484* (2013.01); *G06F 3/0482* (2013.01)

(58) Field of Classification Search
CPC ...... G06F 3/0484; G06F 3/0482; G01R 31/66
See application file for complete search history.

(56) References Cited

U.S. PATENT DOCUMENTS 5,539,652 A * 7/1996 Tegethoff ....... G01R 31/318591
716/54
10,061,424 B2    8/2018 Poornachandran et al.
(Continued)

FOREIGN PATENT DOCUMENTS

CN    100384287 C  *  4/2008
CN    101051965 A      7/2009
(Continued)

OTHER PUBLICATIONS

International Search Report—PCT/CN2021/138849—ISA/CN—Aug. 31, 2022.

*Primary Examiner* — Rashawn N Tillery
(74) *Attorney, Agent, or Firm* — Harrity & Harrity, LLP (57) ABSTRACT

A device may receive topology data identifying a topology of components of a PCI board, and may generate, based on the topology data, a user interface that includes a representation of the PCI board and nodes representing the components of the PCI board. The device may provide the user interface for display, and may receive, via the user interface, a selection of a node from the nodes, where the node represents a component of the components. The device may provide test traffic to the component associated with the node selected via the user interface, and may receive, from the component, test results based on providing the test traffic to the component. The device may determine whether the component is functioning properly based on the test results, and may perform one or more actions based on whether the component is functioning properly.

20 Claims, 8 Drawing Sheets

(56) References Cited

U.S. PATENT DOCUMENTS

| | | | |
|---|---|---|---|
| 2006/0274663 A1* | 12/2006 | Brethereau | H04L 41/069 370/247 |
| 2008/0259816 A1* | 10/2008 | Archer | G06F 30/18 370/254 |
| 2014/0152456 A1* | 6/2014 | Olson | E21B 47/12 340/853.2 |
| 2016/0169969 A1* | 6/2016 | Douskey | G01R 31/318583 714/727 |
| 2016/0378900 A1* | 12/2016 | Okubo | G06F 30/392 716/119 |
| 2018/0302313 A1* | 10/2018 | Blanchard | H04L 49/101 |
| 2023/0011392 A1* | 1/2023 | Zou | G06F 3/04845 |

FOREIGN PATENT DOCUMENTS

| | | | | |
|---|---|---|---|---|
| CN | 102957576 A | * | 3/2013 | |
| CN | 103021204 A | * | 4/2013 | |
| CN | 214377683 U | * | 10/2021 | |
| CN | 113765400 A | * | 12/2021 | |
| JP | 2018132877 A | | 8/2018 | |
| WO | WO-2007042622 A1 | * | 4/2007 | ..... G01R 31/318519 |
| WO | WO-2021152436 A1 | * | 8/2021 | ......... G01R 31/2808 |

* cited by examiner

DISCOVERING AND TESTING A TOPOLOGY OF A PERIPHERAL COMPONENT INTERCONNECT BOARD

CROSS-REFERENCE TO RELATED APPLICATION

This Patent Application is a 371 national stage of PCT Application No. PCT/CN2021/138849 filed on Dec. 16, 2021, entitled "DISCOVERING AND TESTING A TOPOLOGY OF A PERIPHERAL COMPONENT INTERCONNECT BOARD," and assigned to the assignee hereof. The disclosure of the prior Application is considered part of and is incorporated by reference into this Patent Application.

TECHNICAL FIELD

The present disclosure relates generally to a peripheral component interconnect (PCI) board and to discovering and testing a topology of a PCI board.

BACKGROUND

A PCI board or a PCI express (PCIe) board is a local computer bus for attaching hardware devices in a computer and is part of the PCI local bus standard. The PCI board supports functions found on a processor bus, but in a standardized format that is independent of any given processor's native bus. Devices connected to the PCI board appear to a bus master to be connected directly to its own bus and are assigned addresses in the processor's address space.

SUMMARY

Some implementations described herein relate to a method. The method may include receiving topology data identifying a topology of components of a PCI board, and generating, based on the topology data, a user interface that includes a representation of the PCI board and nodes representing the components of the PCI board. The method may include providing the user interface for display, and receiving, via the user interface, a selection of a node from the nodes, where the node represents a component of the components. The method may include providing test traffic to the component associated with the node selected via the user interface, and receiving, from the component, test results based on providing the test traffic to the component. The method may include determining whether the component is functioning properly based on the test results, and performing one or more actions based on whether the component is functioning properly.

Some implementations described herein relate to a device. The device may include one or more memories and one or more processors coupled to the one or more memories. The one or more processors may be configured to receive topology data identifying a topology of components of a PCI board, and generate, based on the topology data, a user interface that includes a representation of the PCI board and nodes representing the components of the PCI board. The one or more processors may be configured to provide the user interface for display, and receive, via the user interface, a selection of a node from the nodes. The one or more processors may be configured to provide test traffic to the component associated with the node selected via the user interface, and receive, from the component, test results based on providing the test traffic to the component. The one or more processors may be configured to determine whether the component is functioning properly based on the test results, and perform one or more actions based on whether the component is functioning properly.

Some implementations described herein relate to a non-transitory computer-readable medium that stores a set of instructions for a device. The set of instructions, when executed by one or more processors of the device, may cause the device to receive topology data identifying a topology of components of a PCI board, and generate, based on the topology data, a user interface that includes a representation of the PCI board and nodes representing the components of the PCI board. The set of instructions, when executed by one or more processors of the device, may cause the device to provide the user interface for display, and receive, via the user interface, a selection of a node from the nodes. The set of instructions, when executed by one or more processors of the device, may cause the device to provide test traffic to the component associated with the node selected via the user interface, and receive, from the component, test results based on providing the test traffic to the component. The set of instructions, when executed by one or more processors of the device, may cause the device to determine whether the component is functioning properly based on the test results, and perform one or more actions based on whether the component is functioning properly.

DETAILED DESCRIPTION

The following detailed description of example implementations refers to the accompanying drawings. The same reference numbers in different drawings may identify the same or similar elements.

A PCI board may be directly connected to a current testing system and to an endpoint device. The current testing system may communicate with and/or test the endpoint device via the PCI board. However, the current testing system may be unable to identify and/or test one or more components (e.g., switches, bridges, and/or the like) of the PCI board. Thus, the current testing system wastes computing resources (e.g., processing resources, memory resources, communication resources, and/or the like), network resources, and/or other resources associated with being unable to identify and test components of a PCI board, generating incorrect test results for the PCI board, and/or the like.

Some implementations described herein provide a device (e.g., a user device) that discovers and tests a topology of a PCI board. For example, the user device may receive topology data identifying a topology of components of a PCI board, and may generate, based on the topology data, a user interface that includes a representation of the PCI board and nodes representing the components of the PCI board. The user device may provide the user interface for display, and may receive, via the user interface, a selection of a node from the nodes, where the node represents a component of the components. The user device may provide test traffic to the component associated with the node selected via the user interface, and may receive, from the component, test results based on providing the test traffic to the component. The user device may determine whether the component is functioning properly based on the test results, and may perform one or more actions based on whether the component is functioning properly.

In this way, the user device may discover and test a topology of a PCI board. For example, the user device may discover the entire topology of components of the PCI board and may display the topology graphically in a user interface. The user device may enable the user to select any component of the PCI board via the topology of the user interface. The user device may then provide test traffic to the selected component in order to test the functionality of the selected component. Thus, the user device may conserve computing resources, networking resources, and other resources that would have otherwise been consumed by being unable to identify and test components of a PCI board, generating incorrect test results for the PCI board, and/or the like.

FIGS. 1A-1E are diagrams of an example 100 associated with discovering and testing a topology of a PCI board. As shown in FIGS. 1A-1E, example 100 includes a user device, an analyzer device, an interposer, and a PCI board. The user device may include a computing device that executes software to control operation of the analyzer device and the interposer when testing the PCI board. The analyzer device may include a device that allows for simultaneous protocol analysis and error injection for the PCI board. The interposer may include an electrical interface that provides a connection between the analyzer device and the PCI board. Further details of the user device, the analyzer device, the interposer, and the PCI board are provided elsewhere herein.

Figure 1A:
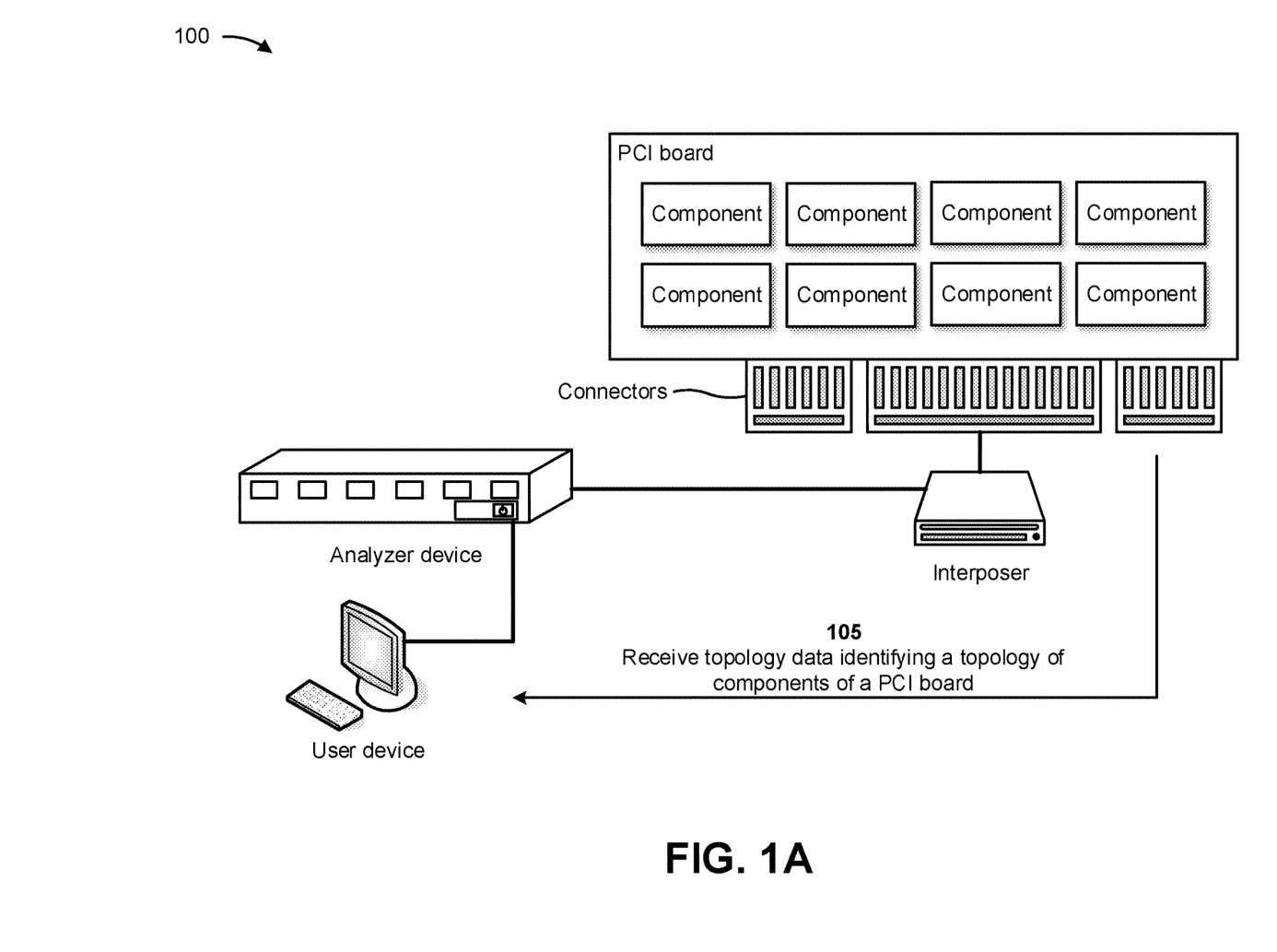
FIGS. 1A-1E are diagrams of an example associated with discovering and testing a topology of a PCI board.

As shown in FIG. 1A, the user device may connect and communicate with the analyzer device via a wireless or wired connection (e.g., a communication cable). The analyzer device may connect and communicate with the interposer via a wireless or wired connection (e.g., a communication cable). The interposer may include one or more connectors (e.g., slots) to receive and retain connectors of the PCI board. The connectors may enable the interposer to communicate with the PCI board. The PCI board may include one or more components, such as switches, bridges, endpoint device connectors, and/or the like.

As further shown in FIG. 1A, and by reference number 105, the user device may receive topology data identifying a topology of the components of the PCI board. For example, the user device may receive the topology data from the PCI board, via the analyzer device and the interposer. The user device may cause the analyzer device to generate one or more communication signals and to provide the one or more communication signals to the interposer. The interposer may provide the communication signals to the PCI board. In some implementations, the communication signals may include signals that enable identification of the components of the PCI board. The PCI board may generate the topology data based on the communication signals, and may provide the topology data to the interposer. The interposer may provide the topology data to the analyzer device, and the analyzer device may provide the topology data to the user device.

Figure 1B:
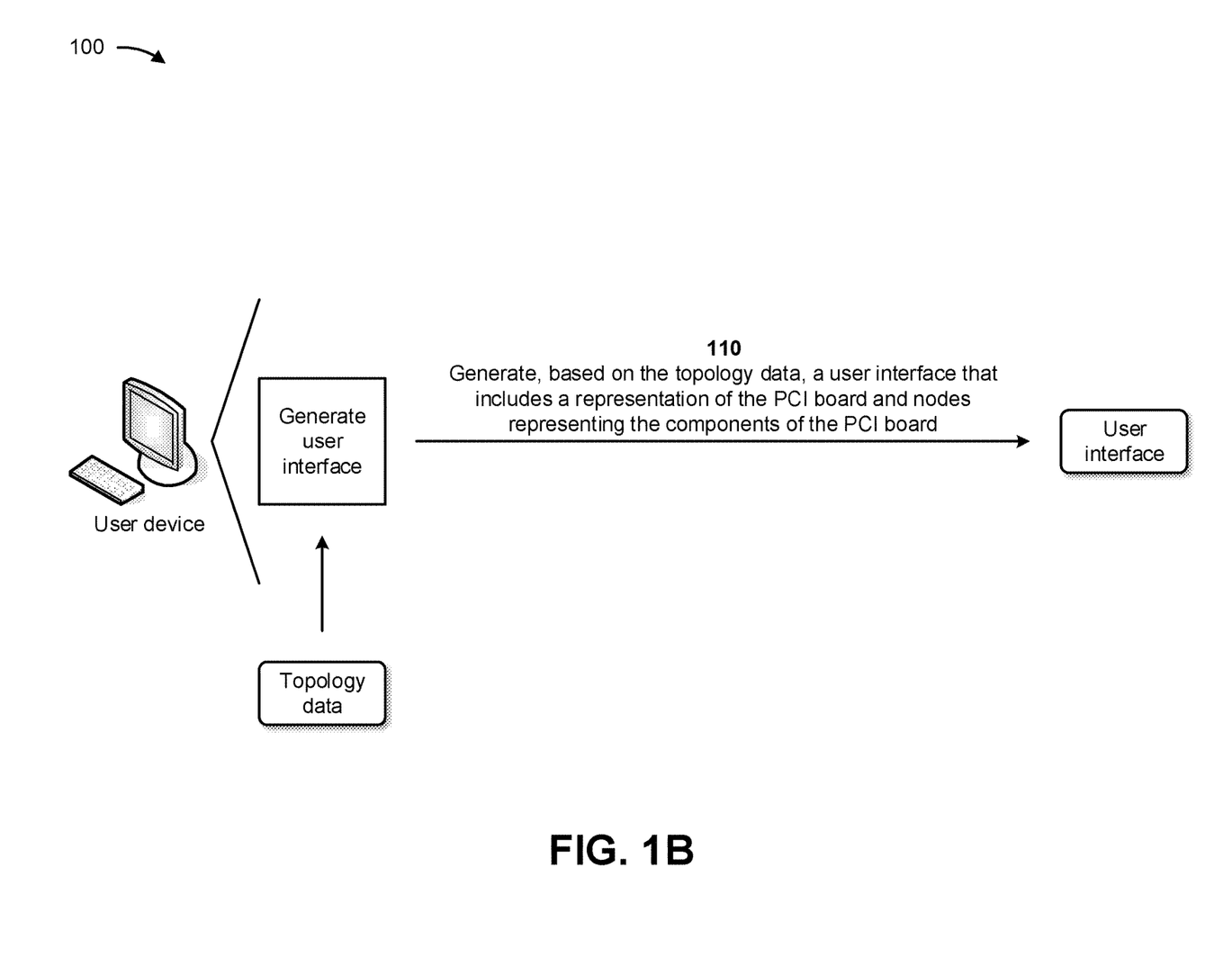

As shown in FIG. 1B, and by reference number 110, the user device may generate, based on the topology data, a user interface that includes a representation of the PCI board and nodes representing the components of the PCI board. For example, the user device may generate a graphical representation of the PCI board and graphical representations (e.g., the nodes) of components of the PCI board based on the topology data. The user device may populate the representation of the PCI board with the nodes to generate the user interface.

Figure 1C:
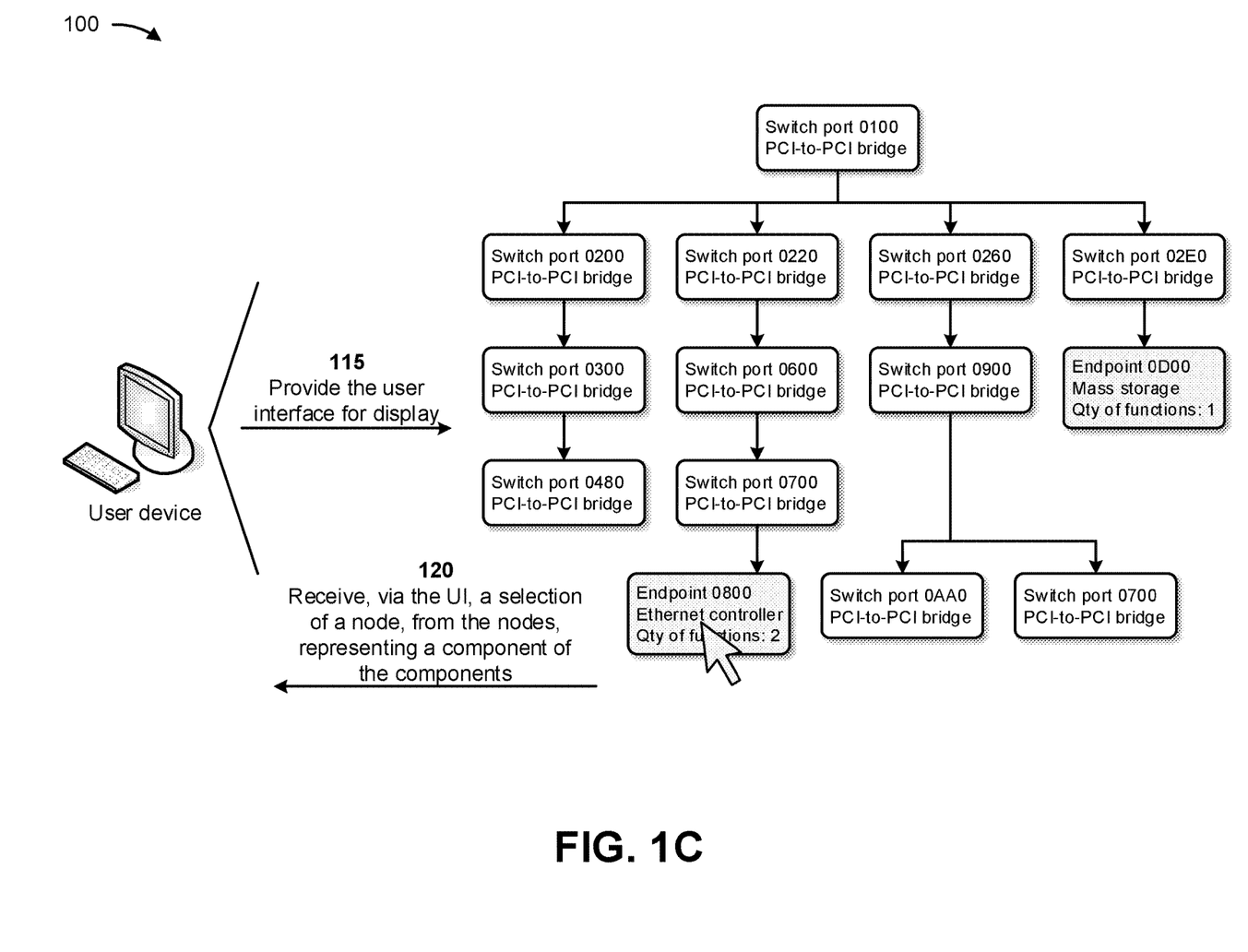

As shown in FIG. 1C, and by reference number 115, the user device may provide the user interface for display to a user of the user device. For example, the user device may provide the user interface for display on a display (e.g., a touch screen) of the user device. The user may utilize the user device to manipulate the user interface. For example, the user may expand, contract, rotate, move, and/or the like the graphical representation of the PCI board and/or the nodes via the user interface. As further shown, the nodes may include multiple switch port (e.g., PCI-to-PCI bridge) nodes that represent multiple switch ports of the PCI board, multiple endpoint device connector nodes that represent multiple endpoint device connectors of the PCI board, and/or the like. For example, the switch port nodes may represent switch ports 0200, 0220, 0260, 02E0, 0300, 0600, 0900, 0480, 0700, 0AA0, and 0700, and the endpoint device connector nodes may represent endpoint device connectors 0D00 (e.g., mass storage) and 0800 (e.g., an Ethernet controller).

As further shown in FIG. 1C, and by reference number 120, the user device may receive, via the user interface, a selection of a node, from the nodes, representing a component of the components. For example, the user may utilize the user device and the user interface to select the node (e.g., the endpoint device connector 0800 node) from the nodes populated on the graphical representation of the PCI board. In some implementations, the user may utilize a touch screen display to select the node from the nodes, may utilize a selection mechanism (e.g., a mouse, a touch pad, and/or the like) to select the node from the nodes, and/or the like. The user device may receive the selection of the node based on the user utilizing the user device and the user interface to select the node. The node (e.g., the endpoint device connector 0800 node) may represent the component (e.g., the endpoint device connector 0800) of the PCI board.

Figure 1D:
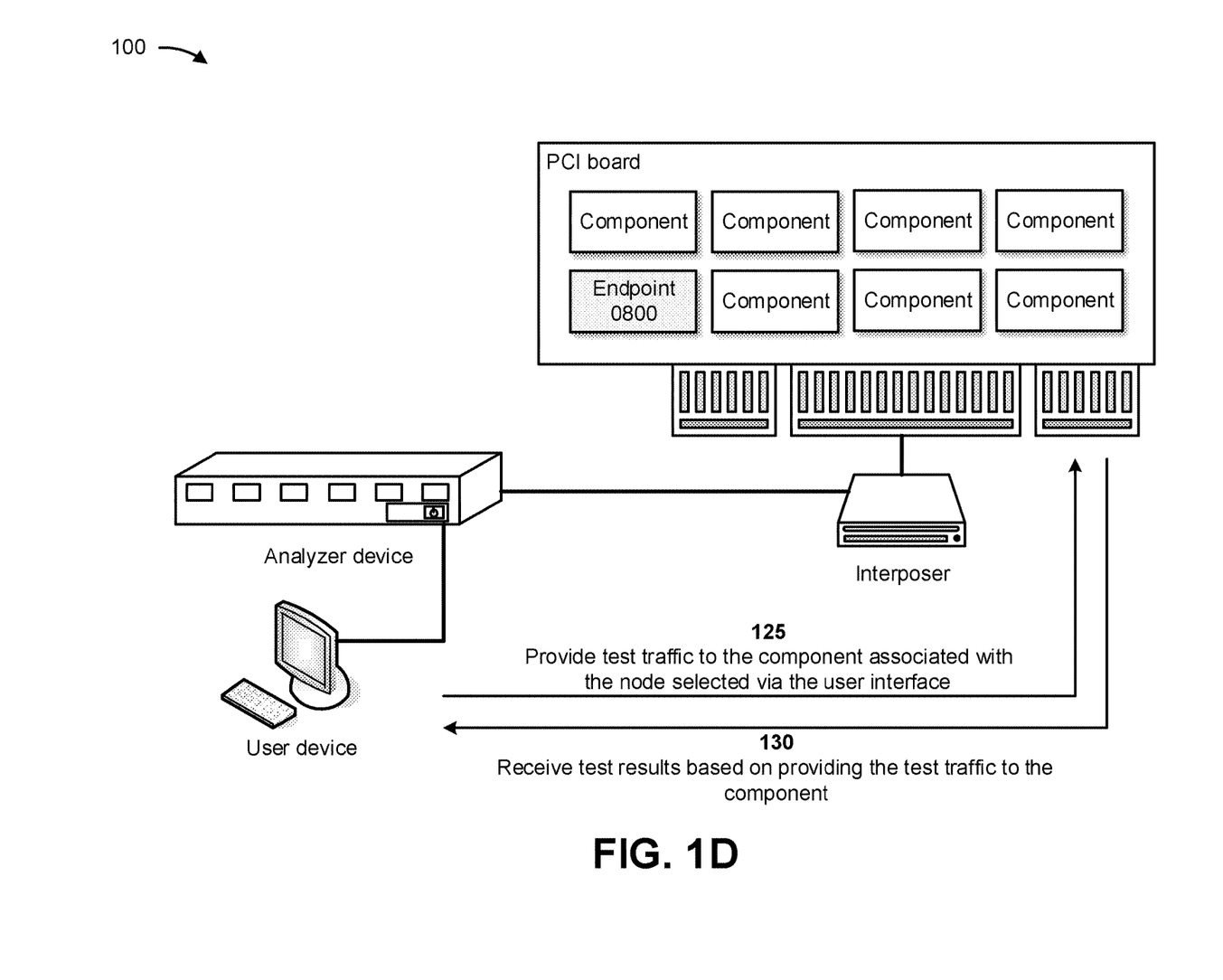

As shown in FIG. 1D, and by reference number 125, the user device may provide test traffic to the component associated with the node selected via the user interface. For example, the user device may identify the component of the PCI board that is associated with the selected node, and may determine test traffic to provide to the component. The test traffic may include traffic that tests one or more functionalities of the component associated with the selected node. Thus, the user device may determine the test traffic based on the functionalities of the component associated with the selected node. The user device may provide the determined test traffic to the component of the PCI board associated with the selected node. For example, the user device may provide the test traffic to the analyzer device (or may instruct the analyzer device to generate the test traffic), and the analyzer device may provide the test traffic to the interposer. The interposer may forward the test traffic to the component of the PCI board that is associated with the selected node. The component may receive the test traffic and may generate test results (e.g., indicating one or more functionalities of the component) based on the test traffic.

As further shown in FIG. 1D, and by reference number 130, the user device may receive the test results based on providing the test traffic to the component. For example, the component may provide the test results to the interposer, and the interposer may forward the test results to the analyzer device. The analyzer device may forward the test results to the user device. The user device may receive the test results from the analyzer device.

Figure 1E:
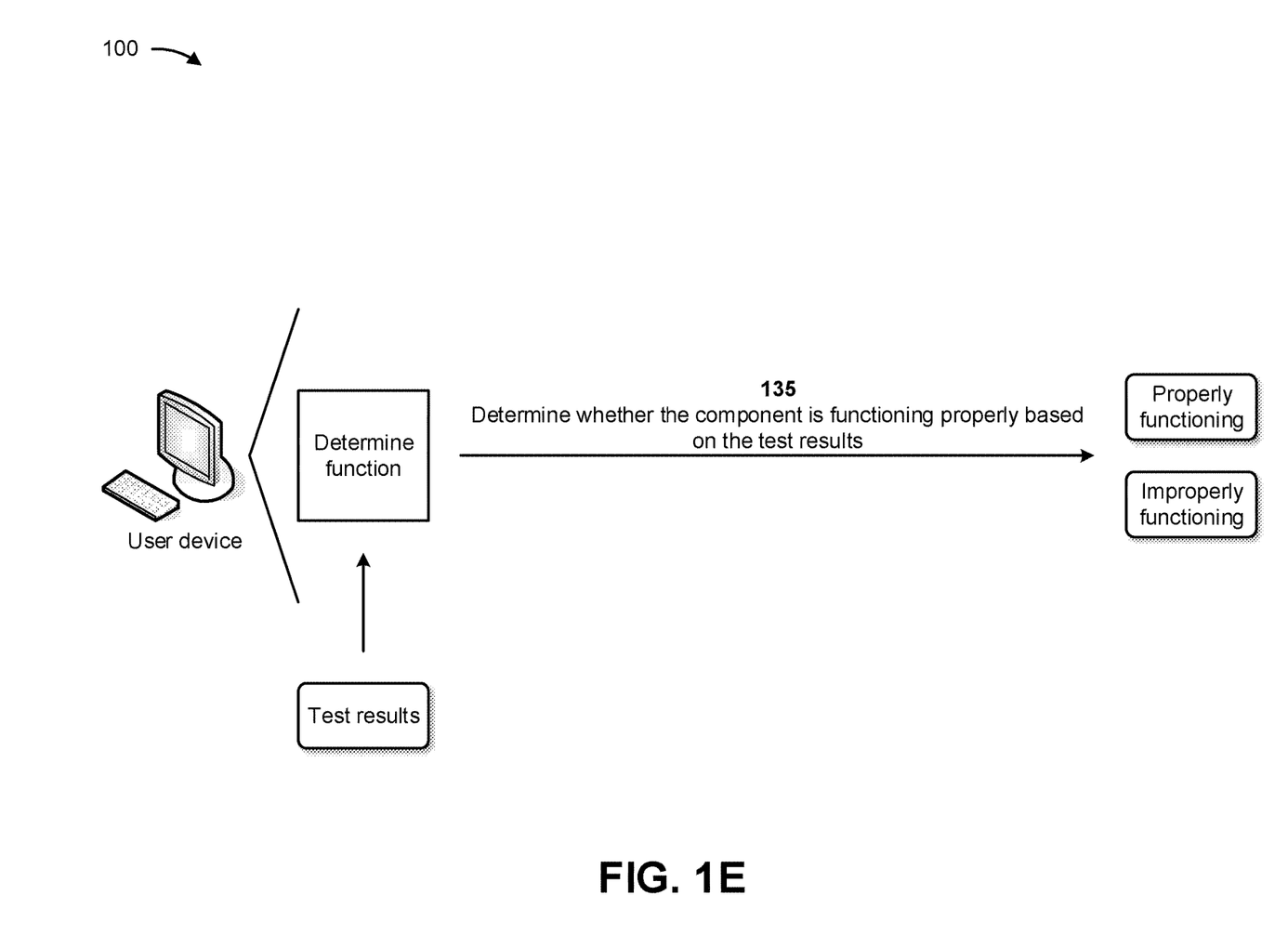

As shown in FIG. 1E, and by reference number 135, the user device may determine whether the component is functioning properly based on the test results. For example, the user device may analyze the test results to determine whether the one or more functionalities of the component are functioning properly. If the one or more functionalities are functioning properly, the user device may determine that the component is functioning properly. If one of the functionalities are not functioning properly, the user device may determine that the component is functioning improperly.

In some implementations, the user device may perform one or more actions based on determining whether the component is functioning properly. For example, the user device may provide information, indicating whether the component is functioning properly, for display to the user of the user device. In other examples, the user device may provide an alert notification when the component is functioning improperly, may modify the component when the component is functioning improperly, and/or the like. In another example, the user device may determine that the component is functioning improperly, and may implement a correction to the component based on determining that the component is functioning improperly.

In this way, the user device may discover and test a topology of a PCI board. For example, the user device may discover the entire topology of components of the PCI board and may display the topology graphically in a user interface. The user device may enable the user to select any component of the PCI board via the topology of the user interface. The user device may then provide test traffic to the selected component in order to test the functionality of the selected component. Thus, the user device may conserve computing resources, networking resources, and other resources that would have otherwise been consumed by being unable to identify and test components of a PCI board, generating incorrect test results for the PCI board, and/or the like.

As indicated above, FIGS. 1A-1E are provided as an example. Other examples may differ from what is described with regard to FIGS. 1A-1E. The number and arrangement of devices shown in FIGS. 1A-1E are provided as an example. In practice, there may be additional devices, fewer devices, different devices, or differently arranged devices than those shown in FIGS. 1A-1E. Furthermore, two or more devices shown in FIGS. 1A-1E may be implemented within a single device, or a single device shown in FIGS. 1A-1E may be implemented as multiple, distributed devices. Additionally, or alternatively, a set of devices (e.g., one or more devices) shown in FIGS. 1A-1E may perform one or more functions described as being performed by another set of devices shown in FIGS. 1A-1E.

Figure 2:
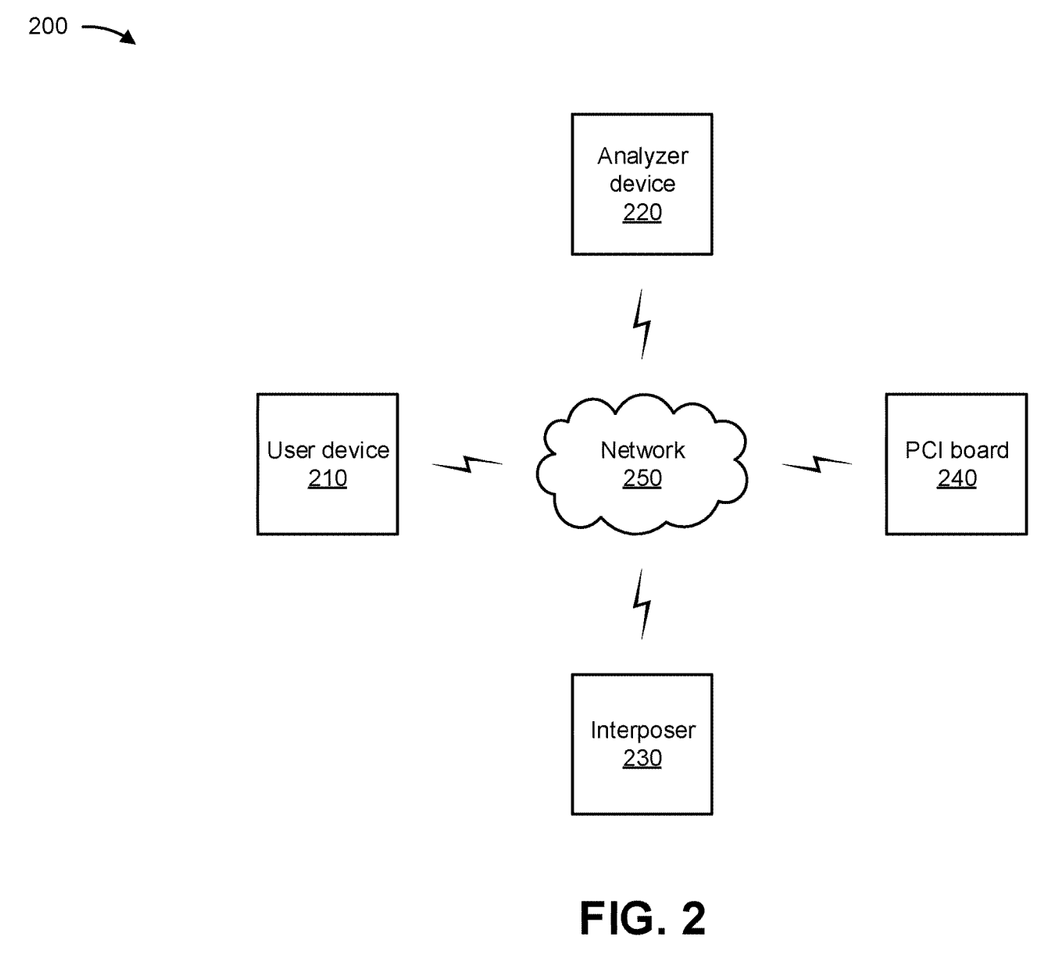
FIG. 2 is a diagram of an example environment in which systems and/or methods described herein may be implemented.

FIG. 2 is a diagram of an example environment 200 in which systems and/or methods described herein may be implemented. As shown in FIG. 2, environment 200 may include a user device 210, an analyzer device 220, an interposer 230, a PCI board 240, and/or a network 250. Devices and/or elements of environment 200 may interconnect via wired connections and/or wireless connections.

The user device 210 includes one or more devices capable of receiving, generating, storing, processing, and/or providing information, as described elsewhere herein. The user device 210 may include a communication device and/or a computing device. For example, the user device 210 may include a wireless communication device, a mobile phone, a laptop computer, a tablet computer, a gaming console, a wearable communication device (e.g., a smart wristwatch, a pair of smart eyeglasses, a head mounted display, or a virtual reality headset), or a similar type of device.

The analyzer device 220 includes one or more devices capable of receiving, generating, storing, processing, and/or providing information, as described elsewhere herein. For example, the analyzer device 220 may include a device that allows for simultaneous protocol analysis and error injection for protocol traffic at all layers of a protocol stack. The analyzer device 220 may include multicolored light-emitting diodes (LEDs) on a front panel that specify link speed, lane width, and signal quality. The analyzer device 220 may provide advanced PCIe and non-volatile memory express (NVMe) trigger and search capabilities designed to reduce debug and problem resolution down time. The analyzer device 220 may support latest PCIe and NVMe specifications and may alert a user (e.g., via the user device 210) to errors at every layer of the PCIe stack, including state and sub-state level errors. The analyzer device 220 may autotune the interposer 230, may provide a configuration space viewer, may calculate PCIe link performance measurements, may trace view packet compression, and/or the like.

The interposer 230 includes one or more devices capable of receiving, generating, storing, processing, and/or providing information, as described elsewhere herein. For example, the interposer 230 may include an electrical interface that provides routing from one socket or connection to another socket or connection. The interposer 230 may spread a connection to a wider pitch or may reroute a connection to a different connection. For example, the interposer 230 may provide a connection between the analyzer device 220 and the PCI board 240 under test. The interposer 230 may enable protocol analysis of communication between the PCI board 240 and the user device 210 and analyzer device 220.

The PCI board 240 includes one or more devices capable of receiving, generating, storing, processing, and/or providing information, as described elsewhere herein. For example, the PCI board 240 may include a local computer bus for attaching hardware devices in a computer and may be part of a PCI local bus standard. The PCI board 240 may support functions found on a processor bus but in a standardized format that is independent of any given processor's native bus. Devices connected to the PCI board 240 may appear to a bus master to be connected directly to its own bus and may be assigned addresses in the processor's address space.

The network 250 includes one or more wired and/or wireless networks. For example, the network 250 may include a wireless wide area network (e.g., a cellular network or a public land mobile network), a local area network (e.g., a wired local area network or a wireless local area network (WLAN), such as a Wi-Fi network), a personal area network (e.g., a Bluetooth network), a near-field communication network, a telephone network, a private network, the Internet, and/or a combination of these or other types of networks. The network 250 enables communication among the devices of the environment 200.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of the environment 200 may perform one or more functions described as being performed by another set of devices of the environment 200.

Figure 3:
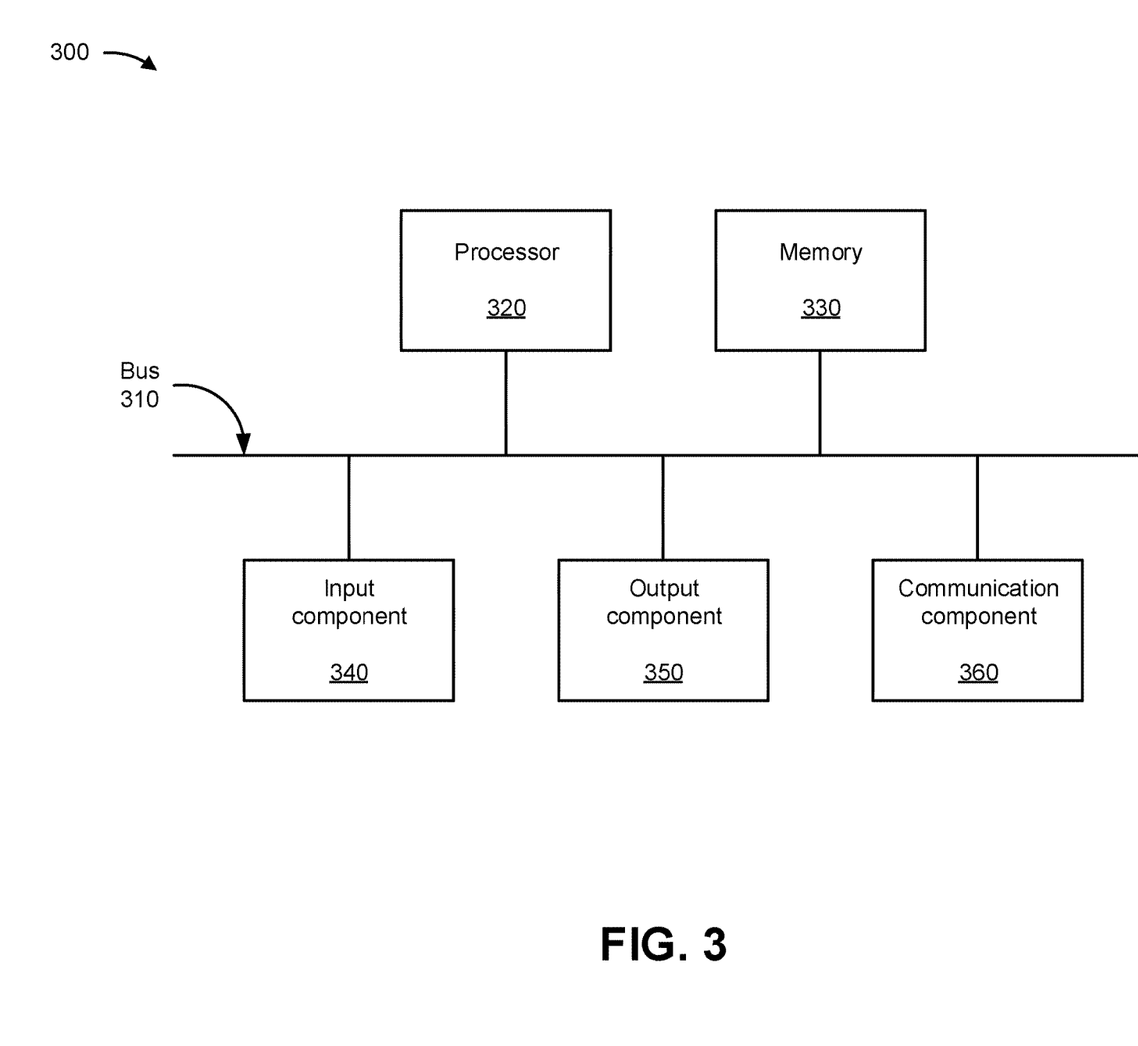
FIG. 3 is a diagram of example components of one or more devices of FIG. 2.

FIG. 3 is a diagram of example components of a device 300, which may correspond to the user device 210, the analyzer device 220, the interposer 230, and/or the PCI board 240. In some implementations, the user device 210, the analyzer device 220, the interposer 230, and/or the PCI board 240 may include one or more devices 300 and/or one or more components of the device 300. As shown in FIG. 3, the device 300 may include a bus 310, a processor 320, a memory 330, an input component 340, an output component 350, and a communication component 360.

The bus 310 includes one or more components that enable wired and/or wireless communication among the components of the device 300. The bus 310 may couple together two or more components of FIG. 3, such as via operative coupling, communicative coupling, electronic coupling, and/or electric coupling. The processor 320 includes a central processing unit, a graphics processing unit, a microprocessor, a controller, a microcontroller, a digital signal processor, a field-programmable gate array, an application-specific integrated circuit, and/or another type of processing component. The processor 320 is implemented in hardware, firmware, or a combination of hardware and software. In some implementations, the processor 320 includes one or more processors capable of being programmed to perform one or more operations or processes described elsewhere herein.

The memory 330 includes volatile and/or nonvolatile memory. For example, the memory 330 may include random access memory (RAM), read only memory (ROM), a hard disk drive, and/or another type of memory (e.g., a flash memory, a magnetic memory, and/or an optical memory). The memory 330 may include internal memory (e.g., RAM, ROM, or a hard disk drive) and/or removable memory (e.g., removable via a universal serial bus connection). The memory 330 may be a non-transitory computer-readable medium. The memory 330 stores information, instructions, and/or software (e.g., one or more software applications) related to the operation of the device 300. In some implementations, the memory 330 includes one or more memories that are coupled to one or more processors (e.g., the processor 320), such as via the bus 310.

The input component 340 enables the device 300 to receive input, such as user input and/or sensed input. For example, the input component 340 may include a touch screen, a keyboard, a keypad, a mouse, a button, a microphone, a switch, a sensor, a global positioning system sensor, an accelerometer, a gyroscope, and/or an actuator. The output component 350 enables the device 300 to provide output, such as via a display, a speaker, and/or a light-emitting diode. The communication component 360 enables the device 300 to communicate with other devices via a wired connection and/or a wireless connection. For example, the communication component 360 may include a receiver, a transmitter, a transceiver, a modem, a network interface card, and/or an antenna.

The device 300 may perform one or more operations or processes described herein. For example, a non-transitory computer-readable medium (e.g., the memory 330) may store a set of instructions (e.g., one or more instructions or code) for execution by the processor 320. The processor 320 may execute the set of instructions to perform one or more operations or processes described herein. In some implementations, execution of the set of instructions, by one or more processors 320, causes the one or more processors 320 and/or the device 300 to perform one or more operations or processes described herein. In some implementations, hardwired circuitry is used instead of or in combination with the instructions to perform one or more operations or processes described herein. Additionally, or alternatively, the processor 320 may be configured to perform one or more operations or processes described herein. Thus, implementations described herein are not limited to any specific combination of hardware circuitry and software.

The number and arrangement of components shown in FIG. 3 are provided as an example. The device 300 may include additional components, fewer components, different components, or differently arranged components than those shown in FIG. 3. Additionally, or alternatively, a set of components (e.g., one or more components) of the device 300 may perform one or more functions described as being performed by another set of components of the device 300.

Figure 4:
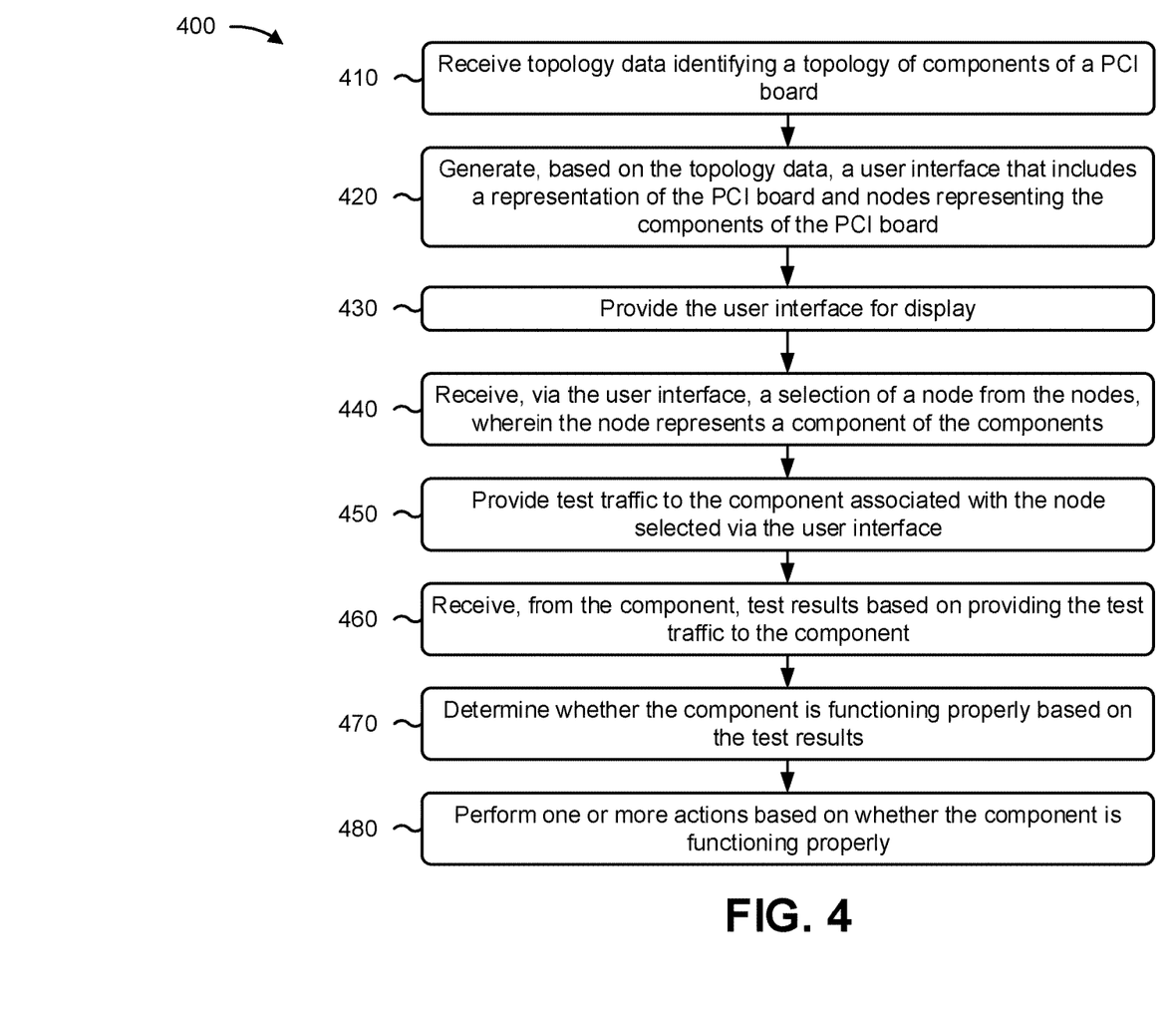
FIG. 4 is a flowchart of an example process for discovering and testing a topology of a PCI board.

FIG. 4 is a flowchart of an example process 400 for discovering and testing a topology of a PCI board. In some implementations, one or more process blocks of FIG. 4 may be performed by a device (e.g., the user device 210). In some implementations, one or more process blocks of FIG. 4 may be performed by another device or a group of devices separate from or including the device, such as an analyzer device (e.g., the analyzer device 220) and/or an interposer (e.g., the interposer 230). Additionally, or alternatively, one or more process blocks of FIG. 4 may be performed by one or more components of the device 300, such as the processor 320, the memory 330, the input component 340, the output component 350, and/or the communication component 360.

As shown in FIG. 4, process 400 may include receiving topology data identifying a topology of components of a PCI board (block 410). For example, the device may receive topology data identifying a topology of components of a PCI board, as described above. In some implementations, receiving the topology data identifying the topology of the components of the PCI board includes providing, to the PCI board, communication signals that enable identification of the components of the PCI board, and receiving the topology data identifying the topology of the components of the PCI board based on providing the communication signals to the PCI board. In some implementations, the device includes a user device connected to an analyzer device, and an interposer connected to the analyzer device and the PCI board.

As further shown in FIG. 4, process 400 may include generating, based on the topology data, a user interface that includes a representation of the PCI board and nodes representing the components of the PCI board (block 420). For example, the device may generate, based on the topology data, a user interface that includes a representation of the PCI board and nodes representing the components of the PCI board, as described above.

As further shown in FIG. 4, process 400 may include providing the user interface for display (block 430). For example, the device may provide the user interface for display, as described above.

As further shown in FIG. 4, process 400 may include receiving, via the user interface, a selection of a node from the nodes, wherein the node represents a component of the components (block 440). For example, the device may receive, via the user interface, a selection of a node from the nodes, as described above. In some implementations, the node represents a component of the components.

As further shown in FIG. 4, process 400 may include providing test traffic to the component associated with the node selected via the user interface (block 450). For example, the device may provide test traffic to the component associated with the node selected via the user interface, as described above. In some implementations, the test traffic includes traffic that tests one or more functionalities of the component associated with the node.

As further shown in FIG. 4, process 400 may include receiving, from the component, test results based on providing the test traffic to the component (block 460). For example, the device may receive, from the component, test results based on providing the test traffic to the component, as described above. In some implementations, the test results identify one or more functionalities of the component associated with the node.

As further shown in FIG. 4, process 400 may include determining whether the component is functioning properly based on the test results (block 470). For example, the device may determine whether the component is functioning properly based on the test results, as described above.

As further shown in FIG. 4, process 400 may include performing one or more actions based on whether the component is functioning properly (block 480). For example, the device may perform one or more actions based on whether the component is functioning properly, as described above. In some implementations, performing the one or more actions includes one or more of providing, for display, information indicating whether the component is functioning properly, providing an alert notification when the component is functioning improperly, or modifying the component when the component is functioning improperly. In some implementations, performing the one or more actions includes determining that the component is functioning improperly, and implementing a correction to the component based on determining that the component is functioning improperly.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

In the preceding specification, various example embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method, comprising:
   receiving, by a device, topology data identifying a topology of components of a peripheral component interconnect (PCI) board;
   generating, by the device and based on the topology data, a user interface that includes a representation of the PCI board and nodes representing the components of the PCI board;
   providing, by the device, the user interface for display;
   receiving, by the device and via the user interface, a selection of a node from the nodes,
      wherein the node represents a component of the components;
   providing, by the device, test traffic to the component associated with the node selected via the user interface;
   receiving, by the device and from the component, test results based on providing the test traffic to the component;
   determining, by the device, whether the component is functioning properly based on the test results; and
   performing, by the device, one or more actions based on whether the component is functioning properly.

2. The method of claim 1, wherein performing the one or more actions comprises one or more of:
   providing, for display, information indicating whether the component is functioning properly;

providing an alert notification when the component is functioning improperly; or modifying the component when the component is functioning improperly.

3. The method of claim 1, wherein performing the one or more actions comprises:

determining that the component is functioning improperly; and implementing a correction to the component based on determining that the component is functioning improperly.

4. The method of claim 1, wherein receiving the topology data identifying the topology of the components of the PCI board comprises:

providing, to the PCI board, communication signals that enable identification of the components of the PCI board; and receiving the topology data identifying the topology of the components of the PCI board based on providing the communication signals to the PCI board.

5. The method of claim 1, wherein the device includes:

a user device connected to an analyzer device, and an interposer connected to the analyzer device and the PCI board.

6. The method of claim 1, wherein the test traffic includes traffic that tests one or more functionalities of the component associated with the node.

7. The method of claim 1, wherein the test results identify one or more functionalities of the component associated with the node.

8. A device, comprising:

one or more memories; and one or more processors, coupled to the one or more memories, configured to:

receive topology data identifying a topology of components of a peripheral component interconnect (PCI) board;

generate, based on the topology data, a user interface that includes a representation of the PCI board and nodes representing the components of the PCI board;

provide the user interface for display;

receive, via the user interface, a selection of a node from the nodes, wherein the node represents a component of the components;

provide test traffic to the component associated with the node selected via the user interface;

receive, from the component, test results based on providing the test traffic to the component;

determine whether the component is functioning properly based on the test results; and perform one or more actions based on whether the component is functioning properly.

9. The device of claim 8, wherein the one or more processors, to perform the one or more actions, are configured to:

provide, for display, information indicating whether the component is functioning properly;

provide an alert notification when the component is functioning improperly; or modify the component when the component is functioning improperly.

10. The device of claim 8, wherein the one or more processors, to perform the one or more actions, are configured to:

determine that the component is functioning improperly; and implement a correction to the component based on determining that the component is functioning improperly.

11. The device of claim 8, wherein the one or more processors, to receive the topology data identifying the topology of the components of the PCI board, are configured to:

provide, to the PCI board, communication signals that enable identification of the components of the PCI board; and receive the topology data identifying the topology of the components of the PCI board based on providing the communication signals to the PCI board.

12. The device of claim 8, wherein the device includes:

a user device connected to an analyzer device, and an interposer connected to the analyzer device and the PCI board.

13. The device of claim 8, wherein the test traffic includes traffic that tests one or more functionalities of the component associated with the node.

14. The device of claim 8, wherein the test results identify one or more functionalities of the component associated with the node.

15. A non-transitory computer-readable medium storing a set of instructions, the set of instructions comprising:

one or more instructions that, when executed by one or more processors of a device, cause the device to:

receive topology data identifying a topology of components of a peripheral component interconnect (PCI) board;

generate, based on the topology data, a user interface that includes a representation of the PCI board and nodes representing the components of the PCI board;

provide the user interface for display;

receive, via the user interface, a selection of a node from the nodes, wherein the node represents a component of the components;

provide test traffic to the component associated with the node selected via the user interface;

receive, from the component, test results based on providing the test traffic to the component;

determine whether the component is functioning properly based on the test results; and perform one or more actions based on whether the component is functioning properly.

16. The non-transitory computer-readable medium of claim 15, wherein the one or more instructions, that cause the device to perform the one or more actions, cause the device to:

provide, for display, information indicating whether the component is functioning properly;

provide an alert notification when the component is functioning improperly; or modify the component when the component is functioning improperly.

17. The non-transitory computer-readable medium of claim 15, wherein the one or more instructions, that cause the device to perform the one or more actions, cause the device to:

determine that the component is functioning improperly; and implement a correction to the component based on determining that the component is functioning improperly.

18. The non-transitory computer-readable medium of claim 15, wherein the one or more instructions, that cause the device to receive the topology data identifying the topology of the components of the PCI board, cause the device to:
   provide, to the PCI board, communication signals that enable identification of the components of the PCI board; and
   receive the topology data identifying the topology of the components of the PCI board based on providing the communication signals to the PCI board.

19. The non-transitory computer-readable medium of claim 15, wherein the device includes:
   a user device connected to an analyzer device, and
   an interposer connected to the analyzer device and the PCI board.

20. The non-transitory computer-readable medium of claim 15, wherein the test traffic includes traffic that tests one or more functionalities of the component associated with the node.

* * * * *